Sept. 19, 1961 M. J. MANAHAN 3,001,067

PULSED MAGNET SATURATION SIGNAL SEEKING TUNER

Filed Jan. 23, 1958 2 Sheets-Sheet 1

INVENTOR
Max J. Manahan
BY R. C. Fowler
ATTORNEY

INVENTOR.
Max J. Manahan
BY R. E. Hobler
ATTORNEY

3,001,067
PULSED MAGNET SATURATION SIGNAL SEEKING TUNER

Max J. Manahan, Kokomo, Ind., assignor to General Motors Corporation, Detroit, Mich., a corporation of Delaware Filed Jan. 23, 1958, Ser. No. 710,725
10 Claims. (Cl. 250—20)

This invention relates to radio receiving apparatus and more particularly to radio receiving apparatus which is automatically tunable over a desired frequency band and indexed or stopped on received signals automatically, said apparatus having no moving parts.

Radio apparatus of course has conventionally utilized a plurality of simultaneously tunable circuits in order to tune in various stations transmitting within a band and to convert modulated waves into audible sound. In a superheterodyne type of receiving apparatus there are usually three tunable circuits, an antenna stage, a radio frequency stage and an oscillator stage. For some time certain types of broadcast radio receivers have been tuned by the variation of inductance in each of the tunable circuits which has been called permeability tuning. This inductance variation has been obtained through the mechanical insertion or withdrawal of comminuted cores associated with the tuning coils. The inductance of a coil may also be changed by varying the saturation of a core upon which the coil is wound and in my copending application S.N. 454,504, filed September 7, 1954, now Patent No. 2,882,391, I have described a radio receiving system in which the inductance of the plurality of tuning coils is varied over a desired band by changing the saturation of the cores upon which the tuning coils are mounted through a programmed change in the current flow in magnetizing windings on said cores. This of course provides tuning also with no moving parts.

The change in saturation of the cores upon which tuning coils are mounted may also be obtained by using a permanent magnet to provide the saturating field instead of an electromagnet and the variation in saturation to provide tuning to different frequencies may be provided by applying charging pulses of gradually increasing magnitude to charge the permanent magnet core. It then retains this charge for an indefinite period of time unless pulses are provided of opposite polarity to degauss or de-magnetize the cores. By providing a permanent magnet whose field saturates core means for the tuning coils and applying to said permanent magnet a series of gradually increasing pulses to gradually charge the magnet, the inductance coils may be caused to tune the receiver over a desired band. In the present instance I have illustrated a means for tuning over the broadcast band but my invention is equally applicable to apparatus for tuning over any desired frequency band.

It is therefore an object in making this invention to provide radio receiving apparatus which is tuned by a variation in inductance provided by a variation in the saturation of the inductance core means.

It is a still further object in making this invention to provide permeability tuning means for raio apparatus in which the inductance is changed by changing the saturation of inductance core means through the use of a pulsed permanent magnet.

It is a still further object in making this invention to provide a pulsed magnet saturation tuning means for a radio receiver which is automatically indexed upon the receipt of an incoming signal.

It is a still further object in making this invention to provide a signal seeking pulsed magnet saturation tuner for a radio receiver in which there are no moving parts.

With these and other objects in view which will become apparent as the specification proceeds, my invention will be best understood by reference to the following specification and claims and the illustrations in the accompanying drawings, in which:

Figure 1:
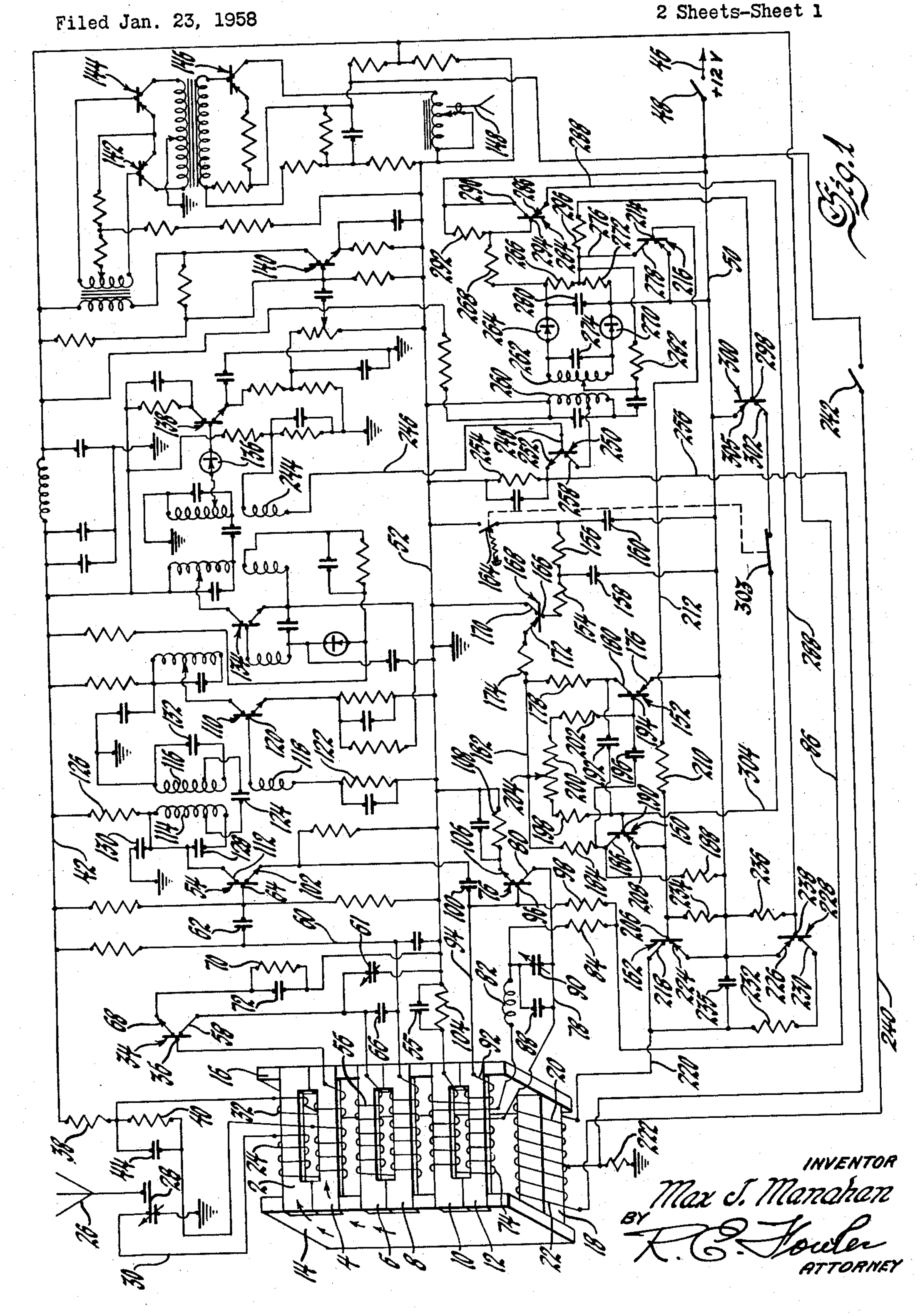
FIGURE 1 is a circuit diagram of a radio receiver embodying my invention.

Referring now more particularly to FIGURE 1, the physical structure of the tuning coil mounting and assembly will now be described. As previously mentioned, a resonant electrical circuit includes both inductance and capacity whose particular values determine said resonant frequency. In order to tune the resonant circuit over a desired band, either the inductance or the capacity must be variable and of the proper value to produce the resonant range desired.

In the current instance, the tuning of the antenna, radio frequency, and oscillator stages is provided through a variation in inductance in each of three coils. This variation in inductance is further provided through a change in the saturation of the cores upon which each of these coils is mounted. At the lefthand side of FIGURE 1, there is shown the physical tuning means. This assembly includes three pairs of ferrite cores 2—4, 6—8, and 10—12 upon which the antenna, radio frequency and oscillator coils are respectively mounted. These pairs of ferrite cores are mounted in notches in one edge of two soft steel end plates 14 and 16. The magnetizing field for these cores is provided by a permanent magnet 18 which extends between the two end plates 14 and 16, and is made of special magnet steel having high retentivity and low coercive force and a sloping, elliptical magnetization curve. Upon the permanent magnet 18 there are wound two windings, one, 20 for applying charging power to the magnet to increase its charge and a second, 22 so poled as to decrease the charge or degauss the magnet. The antenna coil 24 is formed of two sections mounted on the ferrite cores 2 and 4 at the top of the illustration. The antenna 26 is connected through fixed coupling capacity which is part of an adjustable capacity 28. Capacity 28 is connected through conductor 30 to one end of the tunable antenna inductance 24, the other terminal of which is grounded.

Also wound in two halves on the ferrite cores 2 and 4 is a secondary winding 32 which provides the input for radio frequency amplifying transistor 34. One terminal of said secondary winding 32 is directly connected to the base 36 of transistor 34 and the other terminal connected to a point intermediate two resistances 38 and 40 which form a potential divider between power line 42 and ground. A bypass condenser 44 is connected in shunt to resistor 40. Thus when the incoming signal on antenna 26 induces voltage in primary winding 24, the secondary 32 applies this signal to the base 36 of the RF amplifier 34. In order to change the inductance and tune this radio frequency stage, the saturation of the ferrite cores 2 and 4 is varied. The magnetic circuit from the permanent magnet 18 through the end plates 14 and 16 is completed through the ferrite cores as indicated by the small arrows. Thus as the strength of charge of the permanent magnet 18 is changed, the saturation through the ferrite cores 2 and 4 will change to change the inductance of the coils and thus tune the stage.

The power supply for the receiver is obtained from the conventional 12 v. battery source through line 46 which is connected to a main on-off switch 48 and thence to line 50. The upper half of the circuit diagram shown in FIGURE 1 represents the main radio receiver and includes the radio frequency amplifier, mixer, detector and audio amplifier to provide the audible signal from the modulated carirer. That portion of the circuit shown in the lower half of the drawing below ground line 52, is provided to produce the variable amplitude charging and discharging pulses, automatic frequency control section, and signal seeking or automatic indexing control means.

To complete the discussion of the main portion of the radio receiver the output of the radio frequency stage, transistor 34, is connected to the mixer stage, transistor 54, through a tunable resonant circuit including inductance coil 56 wound on ferrite cores 6 and 8. One terminal of said coil 56 is connected to collector electrode 58 of transistor 34 and the other terminal connected through line 60 and coupling condenser 62 to the base 64 of transistor 54. Condenser 66 is connected across tuning coil 56 to complete the resonant circuit. Thus the amplified radio frequency signal is applied to the mixer stage through the base 64. The emitter electrode 68 of the transistor 34 is provided with the proper biasing voltage through resistor 70 connected to ground line 52. Shunt condenser 72 is connected across resistance 70. Line 52 is also connected to the collector electrode 58 through variable condenser 61.

The primary oscillator tuning coil 74 is wound on ferrite cores 10 and 12 and is connected to an oscillator stage including transistor 76. One terminal of the primary oscillator coil is connected through line 78 with the collector electrode 80 of the transistor 76 and the other terminal of the primary winding 74 is connected through inductance coil 82 and resistance 84 to one of the voltage supply lines 86. Parallel condensers 88 and 90 are connected between one terminal of the inductance 82 and line 78 to complete the resonant oscillator circuit. The secondary oscillator coil 92 also wound on ferrite cores 10 and 12 has one terminal connected through line 94 with the base electrode 96 of the transistor 76 and also through biasing resistance 98 to the power line 86. Line 94 is likewise connected through coupling condenser 100 to the emitter electrode 102 of the mixer transistor 54 to apply the oscillator frequency to this stage. The remaining terminal of the secondary oscillator winding 92 is connected through biasing resistor 104 to ground line 52. Condenser 55 is connected in shunt to resistor 104. The emitter electrode 106 of the transistor oscillator 76 is connected through resistance 108 to ground. Thus as the oscillator operates its frequency output is injected into the mixer stage through emitter 102 of transistor 54. It will thus be seen that each of the tunable inductances for the antenna, RF, and oscillator stages will be simultaneously varied according to their predetermined characteristics as the charge on permanent magnet 18 is varied since that permanent magnet provides the saturating flux through the cores of each of these windings.

The output of the mixer stage including transistor 54 is applied to an intermediate frequency stage amplifier including transistor 110 through the connection from the output collector electrode 112 which is connected to a tap on primary IF winding 114. There are two secondary windings for this intermediate frequency coupling transformer, one, 116, and a second, 118. The second winding 118 has one terminal directly connected to base electrode 120 of the transistor 110 and the other terminal connected through base biasing resistor 122 to ground. A coupling condenser 124 is connected between a tap on the primary 114 and a similar top on the secondary 116. The primary 114 of the intermediate frequency transformer has one terminal connected through biasing resistor 126 to power supply line 42 and the opposite terminal connected through series capacitors 128 and 130 to ground. Secondary 116 is tuned to the resonant intermediate frequency through condenser 132 connected thereacross, whereas secondary 118 is untuned. The remaining intermediate frequency amplification is provided by transistor 134 connected to the output of transistor 110 and a signal is then detected in diode 136 and the audio frequency derived therefrom is amplified through audio frequency amplifying transistors 138 and 140 connected in cascade, and to a push-pull output amplifier stage including transistors 142 and 144. A final driver stage 146 is connected to the push-pull amplifier and to the loud speaker 148 where the electrical oscillations are translated into audible sound waves. This portion of the circuit is largely conventional and forms no specific part of the present invention so it will not be described in detail.

As previously mentioned, that portion of the system below line 52 is provided to obtain a discrete series of charging pulses of increasing amplitude in order to tune the receiver over the band, as well as to provide the automatic indexing on the receipt of a station signal. In general, the pulses are provided through a multivibrator section including transistors 150 and 152 and the amplitude of the pulses is varied by the RC network including resistances 154, 156 and condensers 158 and 160, whose connection and operation will be later described in detail. The pulses produced by the multivibrator are amplified through transistor 162 and applied to the charging coil 20. Condenser 160 is connected in series circuit relation with spring biased control switch 164 between main power suply line 50 and ground. Resistance 156 is connected from a point intermediate switch 164 and condenser 160 to the base electrode 166 of transistor 168 through resistance 154. Condenser 158 is connected from a point intermediate the resistors 154 and 156 to the main power line 50. The collector electrode 170 of the transistor 168 is connected directly to ground and the emitter electrode 172 of this transistor is connected through resistor 174 to the multivibrator circuit. This network just described provides a gradually varying signal to control the amplitude of the pulses produced by the multivibrator.

The connections of the multivibrator section incorporating transistors 150 and 152 include a connection for emitter electrode 176 of transistor 152 to the main positive power line 50 and a biasing resistor 178 connected to the collector electrode 180 and to line 182 extending between resistor 174 and a further resistor 184 connected directly to the collector electrode 186 of transistor 150. A biasing resistor 188 is connected between collector electrode 186 and power line 50. The base electrode 190 of transistor 150 is connected to collector electrode 180 of transistor 152 through coupling condenser 192, and in like manner, base electrode 194 of transistor 152 is connected through coupling condenser 196 to collector electrode 186 of transistor 150. A voltage divider including resistances 198, 200 and 202, is connected between base 194 and base 190. A variable tap 204 movable over resistor 200 is directly connected to line 182.

The output pulses provided by this multivibrator section are applied to the base electrode 206 of the transistor 162 from the emitter 208 of transistor 150 which is directly connected thereto. The emitter electrode 208 is likewise connected through resistor 210 and conductive line 212 with the base electrode 214 of transistor 216 which provides a gate control circuit, acting upon the output voltage of the discriminator circuit developed across resistor 272. The negative pulses developed across resistor 234 in the emitter circuit of transistor 150 are applied through series resistor 210 and conductive line 212 to base 214 of transistor 216. This lowers the impedance between collector 278 and the emitter of transistor 216, so as to short out the voltage of the discriminator as developed across resistor 272, during the interval that the charging pulse is applied to winding 20. The collector electrode 218 of transistor 162 is directly connected by conductor 220 with one terminal of the charging winding 20 on permanent magnet 18. The other terminal of the charging winding 20 is connected to ground through resistor 222. The emitter electrode 224 of transistor 162 and emitter electrode 226 of transistor 228 are directly connected to line 50. The collector electrode 230 of transistor 228 is also connected through resistance 232 line 220. Condenser 235 is connected between line 20 and line 50. Transistor 228 is used for automatic frequency control and its control circuit will be later described in detail. A pair of series resistances 234 and 236 are connected across between the base electrodes 206 of transistor 162 and 238 of transistor 228 and the point between these resistances is connected to line 50.

Figure 2:
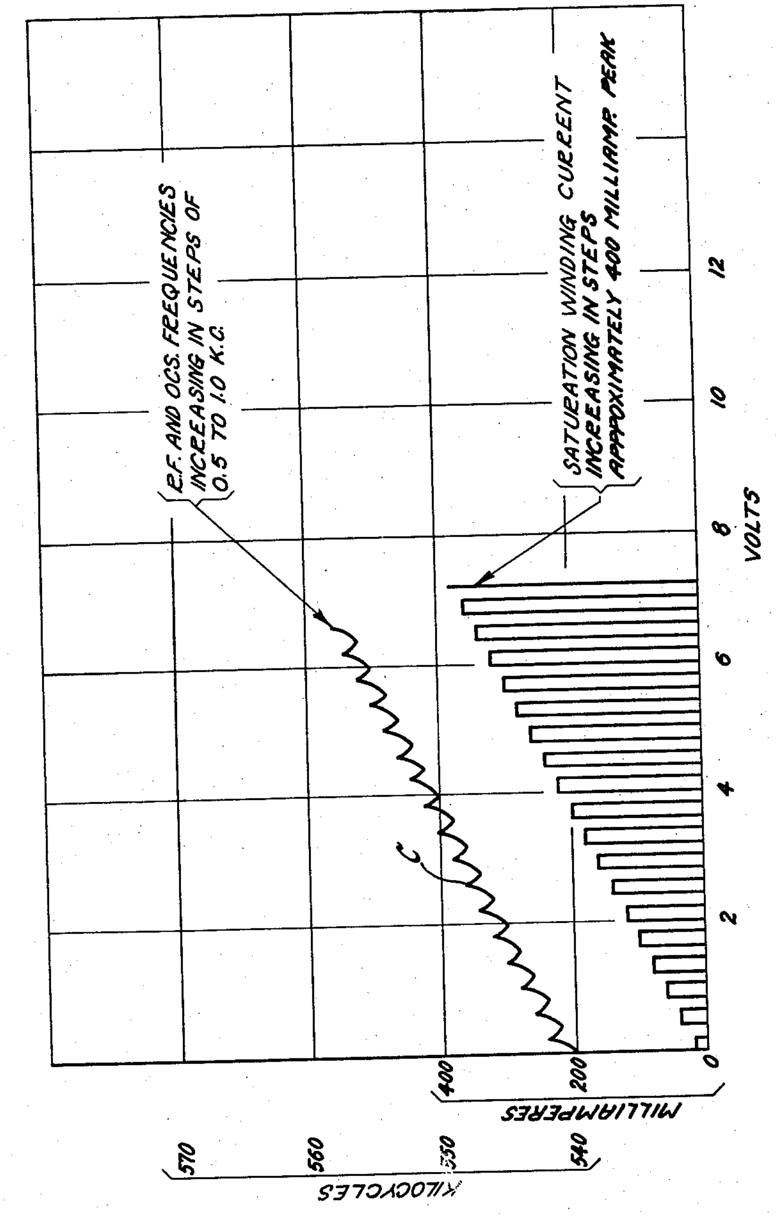
FIGURE 2 is a graph showing how a series of pulses gradually increasing in amplitude cause the tuning frequency to be increased in discrete steps.

The operation of this portion of the system in providing a series of pulses whose amplitude gradually increases to the charging winding 20 will now be described. Assuming that switch 48 is initially closed, when the switch 164 is momentarily closed to initiate operation, current flows from the source of power into condenser 160 charging it quickly to full battery potential inasmuch as there is no substantial resistance in the circuit. Switch 164 is then released and opens. Condenser 158 next begins to charge to a higher and higher potential, the rate of charging of this condenser being determined by the time constant of the circuit including resistance 156 and condenser 158 together with the rate of discharge of condenser 160 into resistance 154 and the resistance of the base to emitter electrodes of transistor 168. Thus, there is a gradual increase of base current in transistor 168 and this allows the voltage supplied to the multivibrator circuit which appears on line 182 to increase gradually from substantially "0" to some fixed value, for example, 6 volts. The multivibrator circuit consisting of transistors 150 and 152 and the various associated resistances and condensers previously specifically described, will now start oscillating and this begins to supply low voltage negative pulses to base 206 of transistor 162. This action starts as soon as condenser 158 begins to charge. As the voltage across condenser 158 increases, the amplitude of the negative pulses delivered to the base 206 of the transistor 162, increases. This drives the collector current pulses in winding 20 to greater and greater amplitude. This action is diagrammatically illustrated in the chart FIGURE 2 where, in the lower portion of the diagram, the current in milliamperes is plotted against the voltage applied to the multivibrator showing how the pulses through the winding 20 gradually increase.

The size of the pulses and the rate of increase can be determined for any desired application which thus determines the time necessary to tune the receiver over a desired band. Each successive pulse of current charges the permanent magnet 18 to a higher and higher flux density and since the member 18 has high retentivity it maintains such higher and higher flux density in the complete magnetic circuit. This of course includes the ferrite cores of the tuning coils and thus the coils are tuned over their desired range. The three coils are tuned simultaneously and increases are at the same rate and in amounts proportionate to the increase in each step of magnetizing current. As mentioned previously, the rate of tuning across the broadcast band is determined by the size of the steps of the current pulses and the rate of operation of the multivibrator. If we are concerned with the normal broadcast band this extends from 540 kilocycles to 1620 kilocycles, the range between the two being 1080 kilocycles. Assuming that the tuner is designed to operate in two kilocycles steps, we would need 540 pulses in order to tune over this range. If the multivibrator operates at 30 pulses per second, then the time required for tuning would be 540 divided by 30, or 18 seconds. This factor can, of course, be easily changed by changing the size of the steps or the speed of multivibrator. It is somewhat limited however, by the so-called magnetic viscosity of the core steel and its influence is to cause a lag which must be taken into account in designing the equipment. It will thus be obvious that upon closing of switch 164 to complete the circuit that changing pulses of increasing amplitude will be applied to the charging winding 20 to cause the tuner to tune over the band for which it was designed.

When the charge in the permanent magnet 18 reaches a point producing saturating flux equivalent to the upper end of the frequency range, means must be provided to degauss or de-energize the permanent magnet 18 to bring it back to its initial magnetic condition so that the band can again be scanned. In order to do this, the degaussing winding 22 must be energized which has the opposite effect to winding 20. The application of said energization to this winding produces the opposite effect of the charging pulses. While, of course, the energization of degaussing winding 22 may be in the same manner as that of applying the charging pulses, it may also be energized by one large pulse to quickly return the permanent magnet 18 to its initial condition. As shown herein, one terminal of the degaussing winding 22 is connected through line 240 to a switch 242 and thence to the power supply line 50. Upon closing of switch 242, a heavy pulse having an opposite effect is applied to the permanent magnet 18 to oppose the charging and discharge the permanent magnet to bring it back to its original condition. Various means can be utilized to close switch 242 upon reaching the upper end of the frequency band. As also mentioned, a series of pulses whose amplitude gradually increases, could be applied to the degaussing winding 22 in the same manner as the charging pulses are applied to charging winding 20 to bring the tuner back down at the same rate in the opposite direction if it is so desired.

The remaining portion of the circuitry shown below line 52 and to the right of the multivibrator is provided in order to give signal seeking or search tuning and automatic frequency control. Basically, a discriminator is used for the stopping function. This discriminator is provided with a signal from the secondary winding 244 of the last IF frequency transformer and applied through line 246 to the base 248 of a limiting amplifier transistor 250. The emitter 252 of this transistor is connected through resistor 254 to ground line 52 and through conductor 256 to resistor 222 in the ground side of winding 20. Collector electrode 258 of transistor 250 is connected directly to a tap on primary winding 260 of a transformer for coupling to the discriminator circuit. This portion of the system is provided to act as a gating circuit so that an IF signal is only fed through to the discriminator after each pulse of magnetizing current and during the time the multivibrator is stopped. The gating action is obtained by utilizing positive pulses of current from resistor 222 on the current side of the charging winding 20. These pulses are fed to the emitter 252 of transistor 250. Primary winding 260 is inductively coupled to secondary winding 262 and has one terminal connected through diode rectifier 264 to a point intermediate two resistances 266 and 268. The opposite terminal of the secondary 262 is in like manner connected through diode rectifier 270 to one end of a resistance 272. The discriminator is tuned by a condenser 274 connected directly across the secondary 262. Resistances 266 and 272 are connected in series and their intermediate point is connected through line 276 with the collector electrode 278 of transistor 216 which likewise acts as a gating control. Condenser 280 is connected in shunt to resistors 266 and 272 and power line 50 to one terminal of the diode rectifier 270. A resistance 282 is connected between line 276 and a center tap on the secondary winding 262. Thus, transistor 216, which has previously been described, has its base 214 connected back to the negative pulsing circuit, acts as a gating control therefore.

The automatic frequency control is provided by transistor 284 whose emitter electrode 286 is connected through line 288 to base electrode 238 of transistor 228. The collector electrode 290 of transistor 284 is connected directly to the power line 50 and resistance 292 is connected across the collector to base terminals of this transistor. Resistance 268 is directly connected to the base electrode 294 thereof. Through these connections, negative pulses that are fed to the base 206 of the transistor 162 for charging pulses are also fed back to the base of the transistor 216 through line 212. These negative pulses applied to the base 214 lower the impedance across resistance 272 of the discriminator load during the time interval of the negative pulse. Therefore, no signal voltage from the discriminator developed across resistances 266 and 272 can be fed to transistor 284 while the core 18 is receiving a charging pulse. This is necessary due to the fact that the oscillator section tunes to a frequency considerably above the desired frequency while the charging pulse of current is passing through the magnetizing winding 20 as shown in chart C and it is necessary to prevent the indexing circuit from stopping during this period. At the end of the charging pulse the amount of flux in the magnetic circuit drops to the amount supplied entirely by the magnet 18, and the rate of dropping depends upon the factor previously mentioned of magnetic viscosity in the steel. There is, therefore, some finite delay before the oscillator frequency reaches a stable point.

By properly timing the gating circuit, just described, to the discriminator we prevent the discriminator from applying indexing stopping signals received from the IF transformer until the oscillator has had time to reach its stable frequency. After the pulse of current has passed through the charging winding 20, and the oscillator has reached a stable frequency, the gating circuit then opens and the discriminator is permitted to operate normally. If the tuner is within a certain range of a station, a negative voltage from the discriminator output 266—272 is fed through resistance 296 which is connected to a point intermediate these two resistances and to the base 298 of the indexing or stopping transistor 300. The collector electrode 302 of transistor 300 is connected through line 304 and a normally closed spring biased disabling switch 303 with the base electrode 190 of transistor 150 of the multivibrator. Switch 303 is ganged to operate with switch 164 but in the opposite phase, it opens when switch 164 closes and vice versa. The emitter electrode 305 of transistor 300 is connected directly to power line 50. The negative voltage applied to the base 298 of transistor 300 by the discriminator output upon receiving a signal from the IF transformer, causes a drop in the impedance between the collector and emitter electrodes 302 and 305 which drop causes a shorting effect on the multivibrator through line 304 and switch 303 and stops the multivibrator from operating. This indexes the set on station.

At the same time, for automatic frequency control, the total output voltage from the discriminator is applied to the base 294 of transistor 284 to control the base current of transistor 228. The collector current of transistor 228 flows through the charging winding 20 of the tuner; therefore, the positive or negative voltage from the discriminator output controls the current through the saturating winding which is in the correct polarity to apply an additional amount of flux to the tuning cores and provides automatic frequency control of a sufficient range in order to take care of voltage and temperature drift in the various circuits.

It is thus obvious that once the control switch 164 has been momentarily closed, the tuner will start scanning operation in applying an ascending series of pulses to the charging winding of the permanent magnet 18 through multivibrator operation until a signal is received in the receiver which through the discriminator, will apply a stopping or shorting signal to the multivibrator, locking the set on station and that once the tuner has reached the maximum saturation, means are provided to return it to the original condition so that scanning may again occur. In order to obtain a new station, if the operator wishes to pass on to the next, switch 164 may be momentarily closed and switch 303 ganged thereto momentarily broken and then closed which will initiate a new cycle. It is necessary to hold the switch 164—303 down long enough to allow the tuner to proceed beyond the station to which it has been tuned. The closing of switch 164 recharges condenser 160 to initiate scanning and the opening of switch 303 unblocks the multi-vibrator so that it may proceed to supply pulses to the tuner.

I claim:

1. In radio receiving means having a plurality of inductance means for tuning tuned circuits to scan the band for which the means is designed, common core means upon which the inductance means are mounted, said core means being of magnetic material having high retentivity and low coercive force and maintaining a magnetic charge indefinitely, a magnetizing winding on said core means, and means connected to said magnetizing winding for generating and applying a series of sequential pulses of gradually increasing amplitude to tune the receiving means over a band.

2. In radio receiving means having a plurality of inductance means for tuning tuned circuits to scan the band for which the means is designed, common core means upon which the inductance means are mounted, said core means being of magnetic material having high retentivity and low coercive force and maintaining a magnetic charge indefinitely, a magnetizing winding on said core means, means connected to said magnetizing winding for generating and applying a series of sequential pulses of gradually increasing amplitude to tune the receiving means over a band, a de-magnetizing winding also mounted on said core, and means to apply de-magnetizing voltages to said last named winding.

3. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, and means including multivibrator means connected to said charging winding to apply a series of pulses of increasing amplitude to cause the radio receiving means to be tuned over the band.

4. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, means including multivibrator means connected to said charging winding to apply a series of pulses of increasing amplitude to cause the radio receiving means to be tuned over the band, a section in the receiving means in which a signal is developed upon the tuning in of a station, and automatic frequency control means connected to the section in which a signal is developed and to the charging winding to maintain the magnetization constant upon the receipt of a station.

5. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, means including multivibrator means connected to said charging winding to apply a series of pulses of increasing amplitude to cause the radio receiving means to be tuned over the band, a section in the receiving means in which a stopping and indexing control voltage signal is developed upon the tuning in of a station, automatic frequency control means connected to the section in which a signal is developed and to the charging winding to maintain the magnetization constant upon the receipt of a station, and gating means connected to said multivibrator output and to the automatic frequency control means to prevent the application of the stopping or indexing control voltage signal to said automatic frequency control means if a charging pulse is being supplied to the charging winding.

6. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, pulse generating means connected to said charging winding, a source of electrical power connected to the pulse generating means and a time delay circuit connected to said pulse generating means to provide for a gradual increase in the amplitude of the pulses generated after initiating a cycle.

7. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, pulse generating means connected to said charging winding, a source of electrical power connected to the pulse generating means, a time delay circuit connected to said pulse generating means to provide for a gradual increase in the amplitude of the pulses generating after initiating a cycle, and switching means connecting said time delay circuit to the source of electrical power to control the cyclic change in pulse amplitude.

8. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, pulse generating means connected to said charging winding, a source of electrical power connected to the pulse generating means, a time delay circuit connected to said pulse generating means to provide for a gradual increase in the amplitude of the pulses generated after initiating a cycle, switching means connecting said time delay circuit to the source of electrical power to control the cyclic change in pulse amplitude, a discharging winding on said core means to degauss the magnetic material when energized and switch control means connecting said discharging winding with the source of electrical power to scan the tunable circuits in the opposite direction.

9. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, means including multivibrator means connected to said charging winding to apply a series of pulses of increasing amplitude to cause the radio receiving means to be tuned over the band, a source of electrical power, a time delay section connected to said source of power and to the multivibrator to control the amplitude of the pulses produced by the multivibrator to gradually increase in size from a given initial point, an intermediate frequency coupling in said radio receiving means in which a signal is developed upon the tuning in of a station, a discriminator connected to said intermediate frequency coupling to develop voltages dependent upon frequency variations from the determined value, an automatic frequency control amplifier stage connected to said discriminator and to the charging winding to lock the receiving means on station under certain conditions.

10. In radio receiving means, a plurality of tunable circuits in said radio receiving means for tuning said radio receiving means over a predetermined band of frequency, inductance means in each tunable circuit whose value is changed, a common core means upon which each inductance means is wound, said core means including a section of magnetic material having high retentivity and maintaining a charge indefinitely, a charging winding on said core means to charge the core means to desired levels to change the tuning of the receiving means, means including multivibrator means connected to said charging winding to apply a series of pulses of increasing amplitude to cause the radio receiving means to be tuned over the band, a source of electrical power, a time delay section connected to said source of power and to the multivibrator to control the amplitude of the pulses produced by the multivibrator to gradually increase in size from a given initial point, an intermediate frequency coupling in said radio receiving means in which a signal is developed upon the tuning in of a station, a discriminator connected to said intermediate frequency coupling to develop voltages dependent upon frequency variations from the determined value, an automatic frequency control amplifier stage connected to said discriminator and to the charging winding to lock the receiving means on station under certain conditions and a gating circuit connected to the discriminator and to the output of the multivibrator to change the impedance across the output of the discriminator so that it cannot develop a stopping voltage for the automatic frequency control and the tunable means will not index as long as a charging pulse is being supplied to the charging winding.

References Cited in the file of this patent

UNITED STATES PATENTS

| | | |
|---|---|---|
| 2,430,457 | Dimond | Nov. 11, 1947 |
| 2,581,202 | Post | Jan. 1, 1952 |
| 2,601,384 | Goodrich | June 24, 1952 |
| 2,777,098 | Duffing et al. | Jan. 8, 1957 |
| 2,897,352 | Smith-Vaniz | July 28, 1959 |